United States Patent [19]
Baska et al.

[11] Patent Number: 5,745,344
[45] Date of Patent: Apr. 28, 1998

[54] HEAT DISSIPATION APPARATUS AND METHOD FOR ATTACHING A HEAT DISSIPATION APPARATUS TO AN ELECTRONIC DEVICE

[75] Inventors: Douglas A. Baska, Oronoco; Darryl J. Becker, Rochester; James D. Bielick, Oronoco; Phillip D. Isaacs; Michael L. Zumbrunnen, both of Rochester, all of Minn.

[73] Assignee: International Business Machines Corporation, Armonk, N.Y.

[21] Appl. No.: 554,633

[22] Filed: Nov. 6, 1995

[51] Int. Cl.$^6$ ........................................... H05K 7/20
[52] U.S. Cl. ................... 361/705; 165/80.3; 165/185; 174/16.3; 257/713; 361/715; 361/718
[58] Field of Search ................... 165/80.2, 80.3, 165/185; 174/16.3; 257/706, 707, 712, 713, 718, 719; 361/704, 705, 708, 715–718, 722

[56] References Cited

U.S. PATENT DOCUMENTS

| | | |
|---|---|---|
| 4,403,102 | 9/1983 | Jordan et al. . |
| 4,567,505 | 1/1986 | Pease et al. . |
| 4,620,215 | 10/1986 | Lee . |
| 4,763,225 | 8/1988 | Frenkel et al. . |
| 4,915,167 | 4/1990 | Altoz ........................................ 361/705 |
| 5,057,909 | 10/1991 | Mok et al. . |
| 5,109,317 | 4/1992 | Miyamoto et al. . |
| 5,126,829 | 6/1992 | Daikoku et al. . |
| 5,276,586 | 1/1994 | Hatsuda et al. ........................... 361/705 |
| 5,459,352 | 10/1995 | Layton et al. ............................ 361/705 |
| 5,587,882 | 12/1996 | Patel ........................................ 361/719 |

OTHER PUBLICATIONS

Chu, et al., "Thermal Interface," IBM Technical Disclosure Bulletin, vol. 20, No. 2, Jul. 1977, pp. 680–681.

*Primary Examiner*—Gregory D. Thompson
*Attorney, Agent, or Firm*—Felsman, Bradley, Gunter & Dillon

[57] ABSTRACT

An apparatus for dissipating heat generated by an electronic device and a method for mounting the apparatus to an electronic device are disclosed. The apparatus includes a heat transfer body which is mounted in proximity to an electronic device. In addition, the apparatus includes an adhesive distributed on the heat transfer body, which affixes the heat transfer body in proximity to the electronic device. The adhesive is distributed on the heat transfer body such that heat transfer from the electronic device to the heat transfer body occurs substantially independently from the adhesive. The apparatus further includes a thermally conductive material disposed between the electronic device and the heat transfer body. The thermally conductive material is selected to maximize heat transfer from the electronic device to the heat transfer body.

12 Claims, 7 Drawing Sheets

HEAT DISSIPATION APPARATUS AND METHOD FOR ATTACHING A HEAT DISSIPATION APPARATUS TO AN ELECTRONIC DEVICE

BACKGROUND OF THE INVENTION

1. Technical Field:

The present invention relates in general to thermal management of electronic devices and in particular to a heat dissipation apparatus for an electronic device. Still more particularly, the present invention relates to a heat sink apparatus and method for attaching the heat sink apparatus to an electronic device, wherein the heat sink apparatus is mechanically attached to the electronic device by adhesive and thermally coupled to the electronic device by a thermally conductive material.

2. Description of the Related Art:

As the performance requirements for computers and other electronic equipment increase, the integrated circuit (IC) components comprising the electronic equipment operate at higher power and are manufactured at increased device densities. As a result, greater emphasis is being placed on the utilization of heat sinks and other means for managing the thermal environment of the IC components.

A conventional package for an IC chip includes a substrate to which the chip is electrically connected and a cap which seals the chip within the package. In addition, the package typically includes a thermal paste sandwiched between the cap and the upper chip surface which conducts heat from the chip to the cap. Packages for high-power chips often utilize a heat sink attached to the package cap to enhance the efficiency of heat transfer from the package cap to the surrounding environment, thereby maintaining the temperature of the chip within the recommended operating temperature range.

As will be appreciated by those skilled in the art, heat sinks can be attached to IC packages by a variety of means, including clamps, screws, and other hardware, as well as thermally conductive adhesives. Because of the package-dependence of clamp or screw-mounted heat sinks and the additional labor required to attach clamp and screw-mounted heat sinks to packages, electronic device manufacturers often prefer utilizing adhesive-mounted heat sinks in order to minimize production costs. However, because materials having desirable adhesive properties typically do not have a high thermal conductivity, it is difficult to provide a high performance heat sink at a low cost.

Consequently, it would be desirable to provide an improved heat sink apparatus and method for attaching a heat sink apparatus to an electronic device which enable a high thermal performance heat sink apparatus to be assembled with minimal labor utilizing low-cost materials.

SUMMARY OF THE INVENTION

It is therefore one object of the present invention to provide an improved method and apparatus for thermal management of an electronic device.

It is another object of the present invention to provide an improved heat dissipation apparatus for an electronic device.

It is yet another object of the present invention to provide an improved heat sink apparatus and method for attaching the heat sink apparatus to an electronic device, wherein the heat sink apparatus and electronic device are mechanically attached by adhesive and thermally coupled by a thermally conductive material.

The foregoing objects are achieved as is now described. An apparatus for dissipating heat generated by an electronic device and a method for mounting the apparatus to an electronic device are disclosed. The apparatus includes a heat transfer body which is mounted in proximity to an electronic device. In addition, the apparatus includes an adhesive distributed on the heat transfer body, which affixes the heat transfer body in proximity to the electronic device. The adhesive is distributed on the heat transfer body such that heat transfer from the electronic device to the heat transfer body occurs substantially independently from the adhesive. The apparatus further includes a thermally conductive material disposed between the electronic device and the heat transfer body. The thermally conductive material is selected to maximize heat transfer from the electronic device to the heat transfer body.

The above as well as additional objects, features, and advantages of the present invention will become apparent in the following detailed written description.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF PREFERRED EMBODIMENT

Figure 1A:
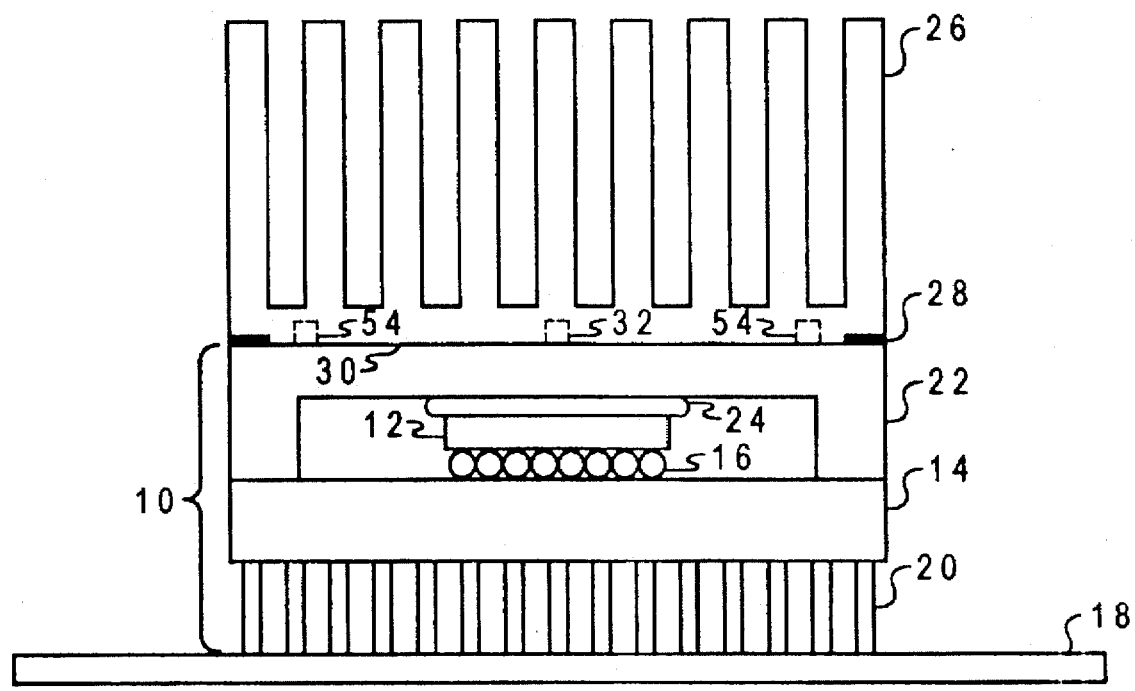
FIG. 1A illustrates a capped single chip module to which a preferred embodiment of the heat sink apparatus of the present invention is attached.

With reference now to the figures and in particular with reference to FIG. 1A, there is illustrated a single chip module to which a heat sink is attached according to the method and system of the present invention. As illustrated, single chip module (SCM) 10 comprises a single integrated circuit chip 12 which is electrically connected to substrate 14 by chip connection 16. In the depicted embodiment, chip connection 16 comprises microballs of non-eutectic solder which form a controlled collapsible chip connection (C4). Electrical signals transmitted to substrate 14 by chip connection 16 are conducted to other electronic devices mounted on circuit card 18 by multiple pins 20. Chip 12 is sealed within SCM 10 by cap 22, which is formed of aluminum, thermoplastic, ceramic, or other suitable material. As is typical in IC packaging, heat generated by chip 12 is transferred to cap 22 through a layer of thermal paste 24, which intimately contacts the upper surface of chip 12 and the lower surface of cap 22. The design of SCM 10 forms no part of the present invention and is provided for illustrative purposes only. From the following description, those skilled in the art will appreciate that the present invention is package-independent and is therefore equally applicable to ball grid array (BGA), ceramic column grid array (CCGA), quad flat package (QFP), pin grid array (PGA), capless SCMs, multi-chip modules (MCMs) or any other electronic device package to which a heat sink may be attached.

To maintain chip 12 within its recommended operating temperature range, SCM 10 is provided with heat sink 26, which in the depicted embodiment comprises a finned heat sink. Although heat sink 26 is illustrated as a finned heat sink, other heat sink configurations such as pinned, impingement, staggered pins, and offset-strip fins may be utilized. According to the present invention, heat sink 26 is mechanically attached to SCM 10 by adhesive 28, which in the depicted embodiment is disposed between heat sink 26 and SCM 10 at a number of locations. Because adhesive 28 is not utilized as the primary thermal interface between SCM 10 and heat sink 26, adhesive 28 may be selected based upon its adhesive properties and not its thermal conductivity. Thus, pressure-sensitive adhesive, UV-sensitive adhesive, epoxy, or any other suitable type of adhesive may be utilized. Of course, the adhesive selected for use in a particular application should have a modulus and strength appropriate for that application.

Figure 1B:
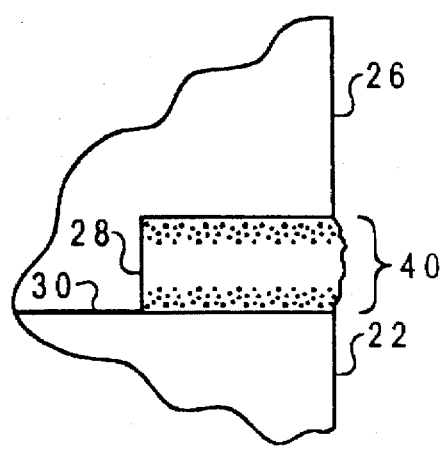
FIG. 1B illustrates a closeup view of the adhesive utilized to attach the heat sink apparatus to the capped single chip module in FIG. 1A.

As depicted in FIG. 1A, adhesive 28 is preferably disposed adjacent to the edges of SCM 10 and away from the primary heat transfer region of cap 22, which is typically the center. Referring now to FIG. 1B, there is depicted a closeup view of a corner of heat sink 26, which illustrates adhesive 28 housed within a recess 40. Although recess 40 is preferably configured as a notch in the perimeter of the bottom surface of heat sink 26, those skilled in the art will appreciate that a number of recess geometries, including bevels (chamfers) or wells, may be employed. Regardless of which recess geometry is utilized in a particular application, recess 40 must have sufficient depth to accommodate the minimum amount of adhesive required to achieve the shear bonding strength required in that application. For example, for a typical adhesive the minimum thickness which provides acceptable shear strength characteristics is approximately 0.010 in.

Figure 2:
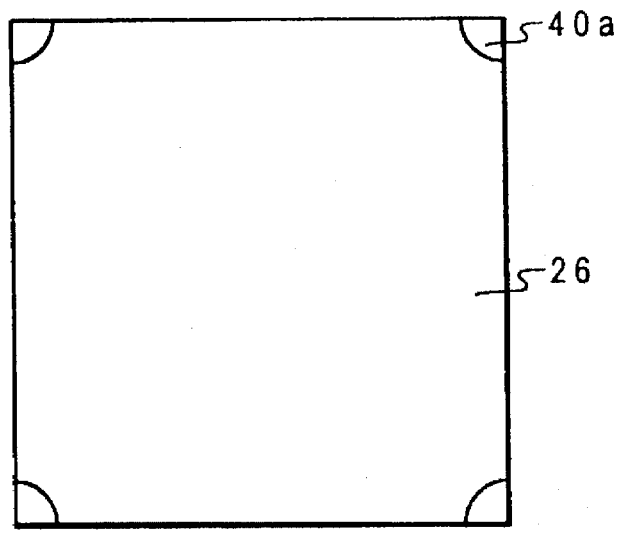
FIG. 2 depicts a bottom plan view of a first preferred embodiment of the heat sink illustrated in FIG. 1A.
Figure 3:
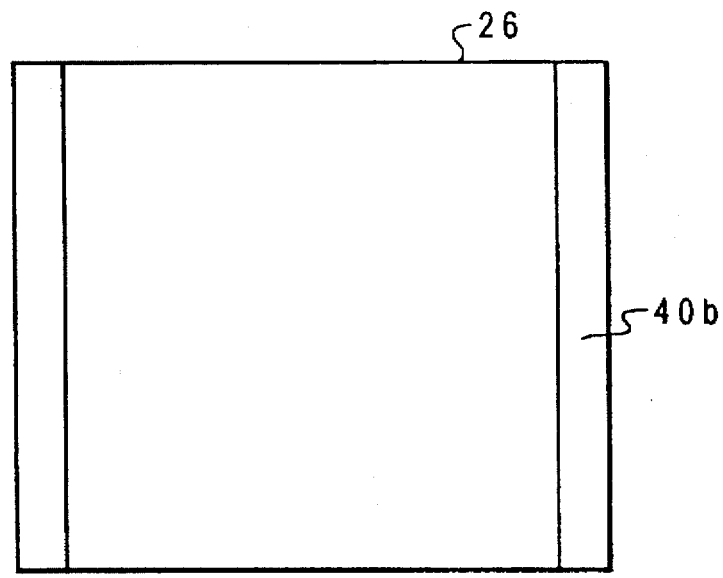
FIG. 3 illustrates a bottom plan view of a second preferred embodiment of the heat sink illustrated in FIG. 1A.

With reference now to FIGS. 2 and 3, there are depicted bottom plan views of two alternative embodiments of heat sink 26. FIG. 2 illustrates an embodiment of heat sink 26 having a recess 40a at each of the four corners of heat sink 26. Thus, according to a first preferred embodiment of heat sink 26, heat sink 26 is mechanically attached to SCM 10 by adhesive 28 disposed within each of recesses 40a. As illustrated in FIG. 3, in a second preferred embodiment of heat sink 26, recesses 40b extend the length of each of two opposing sides of heat sink 26. Thus, in the second preferred embodiment, heat sink 26 is affixed to SCM 10 by at least one bead of adhesive disposed within each of recesses 40b. The design of the second preferred embodiment of heat sink 26 is economically advantageous because heat sink 26, including recesses 40b, can be formed by extrusion.

Figure 4:
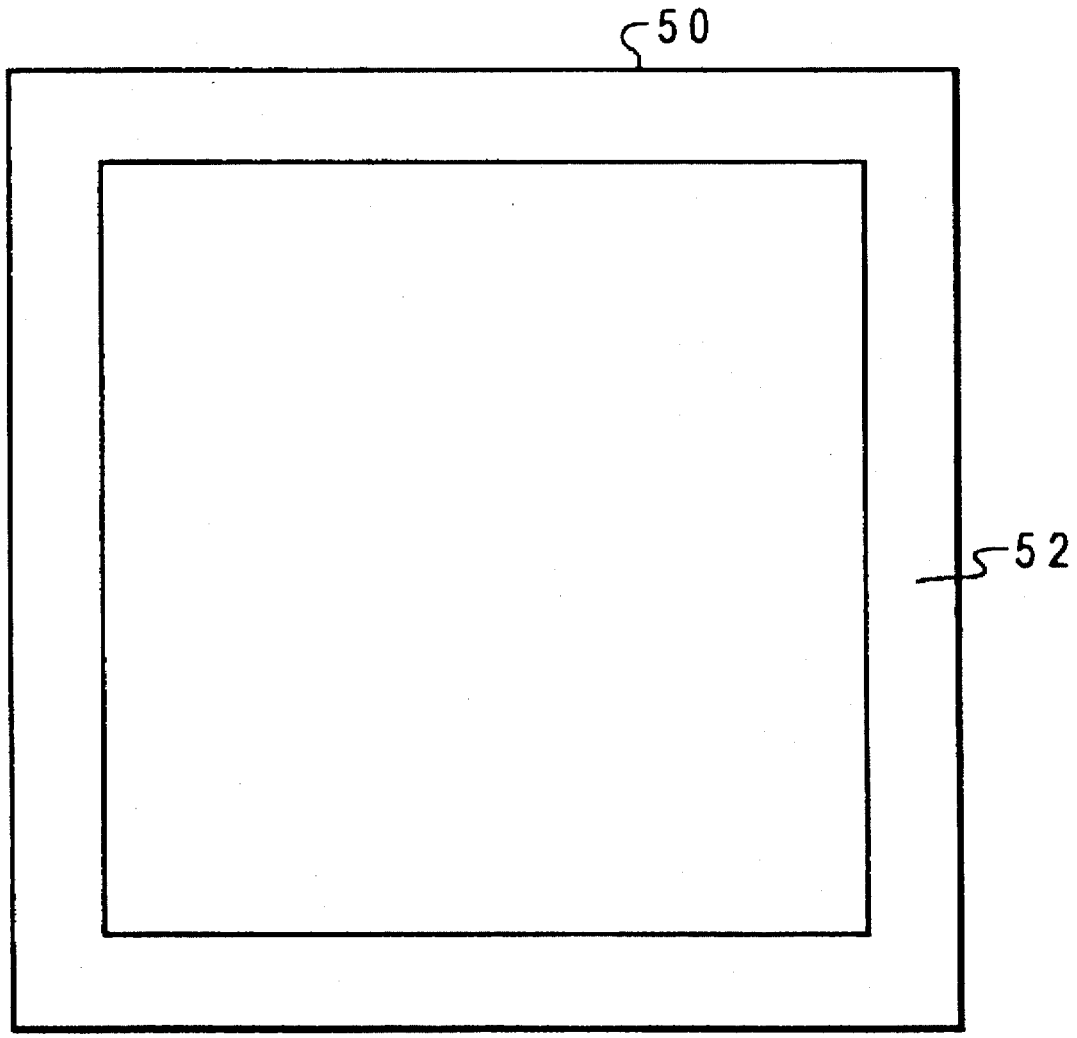
FIG. 4 depicts a bottom plan view of a heat sink having a recess around the perimeter of the bottom surface according to the present invention.

Referring now to FIG. 4, there is depicted a bottom plan view of heat sink 50 which has a recess 52 around the perimeter of its lower surface. Because of the large surface area within recess 52 to which adhesive can be applied, heat sink 50 is advantageously utilized in applications which require a large or heavy (e.g., copper) heat sink, which are subjected to vibration, or which require a particularly strong adhesive bond.

Referring again to FIG. 1A, heat is transferred between cap 22 and heat sink 26 through thermally conductive material 30. Thermally conductive material 30 is preferably a low viscosity oil (e.g., poly($\alpha$-olefin)), graphite, or other material selected for its high thermal conductivity. The interface gap between heat sink 26 and cap 22, which is determined in part by the volume of thermally conductive material 30, the amount of adhesive 28 utilized, and the flatness and finish of heat sink 26 and cap 22, is preferably only a few microns or less wide to minimize thermal resistance. Because the interface gap between heat sink 26 and cap 22 is substantially narrower than the gaps in prior art heat sink apparatuses which utilize a thermally conductive adhesive to transfer heat between an electronic device and a heat sink, the thermal performance of the present invention is greatly enhanced. As described below with respect to FIGS. 5A and 5B, heat sink 26 also optionally includes either isolation channels 54 or isolation channel 32 to minimize contact between thermally conductive material 30 and adhesive 28.

Figure 5A:
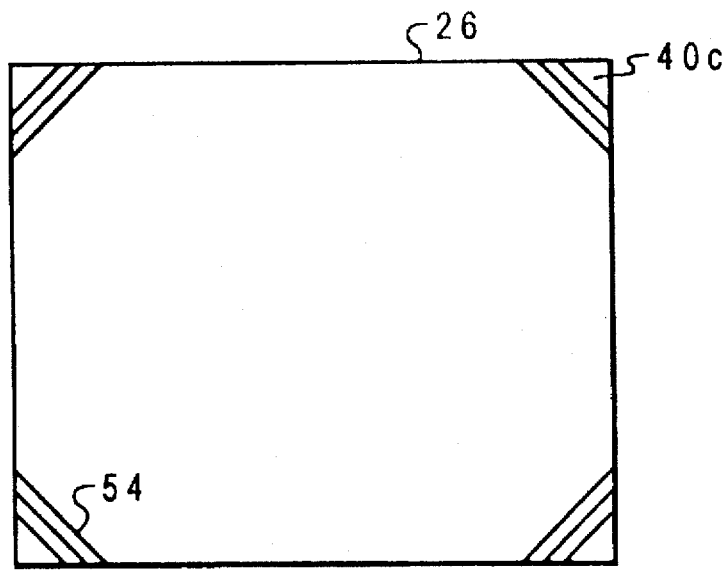
FIG. 5A and 5B illustrate bottom plan views of two heat sink apparatuses having one or more isolation channels formed therein according to the present invention.
Figure 5B:
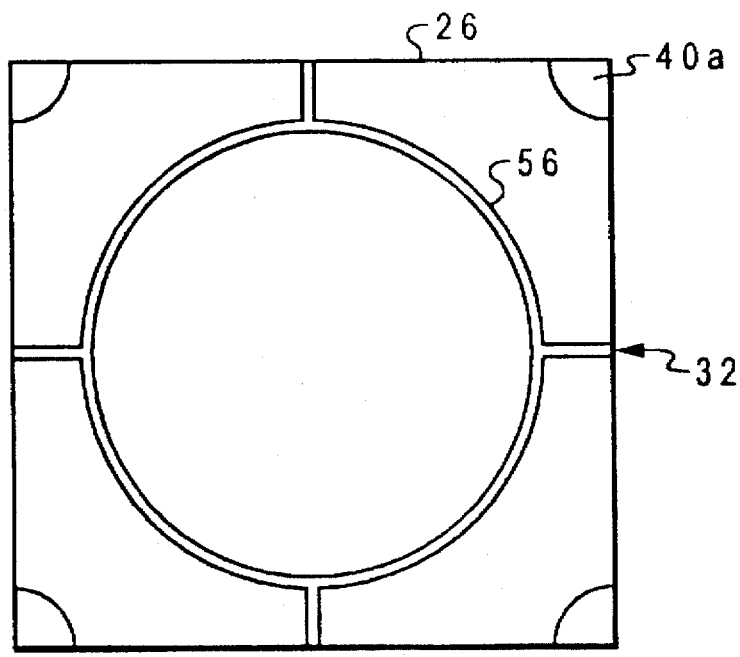

With reference now to FIGS. 5A and 5B, there are illustrated bottom plan views of third and fourth alternative embodiments of heat sink 26 of FIG. 1A which depict one or more isolation channels formed within the bottom surface of heat sink 26. Referring first to FIG. 5A, adhesive 28 within each of recesses 40c is isolated from thermally conductive material 30 by an isolation channel 54 formed within the bottom surface of heat sink ;26. Isolation channels 54 restrict contact between thermally conductive material 30 and adhesive 28 because the open volume of isolation channels 54 is less resistive to fluid flow than the narrow interface gap between the lower surface of heat sink 26 and cap 22. Thus, portions of thermally conductive material 30 flowing into isolation channels 54 will tend to fill isolation channels 54 rather than flow toward recesses 40c. Isolation of thermally conductive material 30 from adhesive 28 may or may not be required depending upon the chemical properties of the selected thermally conductive material 30 and adhesive 28. Accordingly, isolation channels 54 are depicted in FIG. 1A utilizing dashed-line illustration. However, in many applications isolation of thermally conductive material 30 and adhesive 28 is required at least prior to curing adhesive 28 in order to prevent degradation of adhesive 28. As will be appreciated by those skilled in the art, the depth and volume of isolation channels 54 are dependent on a variety of factors, including the volume and viscosity of thermally conductive material 30. For example, in a typical application isolation channels 54 are 0.020 in deep and 0.020 in wide. Isolation channels 54 can be machined into the bottom surface of heat sink 26 or may alternatively be formed during casting of heat sink 26.

With reference now to FIG. 5B, the fourth alternative embodiment of heat sink 26 is provided with a isolation ring 56 within the bottom surface of heat sink 26. As will be appreciated by those skilled in the art, thermally conductive material 30 disposed between cap 22 and heat sink 26 expands as the temperature of SCM 10 increases. In order to prevent thermally conductive material 30 from contacting adhesive 28 within recesses 40a or from escaping from the interface gap between cap 22 and heat sink 26, isolation ring 56 is designed with sufficient volume to accommodate the expanded volume of thermally conductive material 30. Thus, isolation ring 56 serves as a thermal expansion reservoir for thermally conductive material 30 in applications where this is required. As illustrated within FIGS. 1A and 5A, isolation ring 56 communicates with the environment of SCM 10 via inlets 32. In some embodiments of the present invention, heat sink 26 is preferably affixed to cap 22 prior to introducing thermally conductive material 30 in order to maximize the bonding strength of adhesive 28. In these embodiments of the present invention, thermally conductive material 30 is introduced into inlets 32 after the attachment of heat sink 26 and is drawn into isolation ring 56 (and subsequently the interface gap) by capillary action. Like isolation channels 54 depicted in FIG. 5A, isolation ring 56 and inlets 32 may be formed during the casting of heat sink 26 or alternatively by machining. Again, the depth and geometry of inlets 32 and isolation ring 56 represent a design choice influenced by other features of the heat sink apparatus, such as the selected thermally conductive material 30 and the interface gap spacing.

Figure 6:
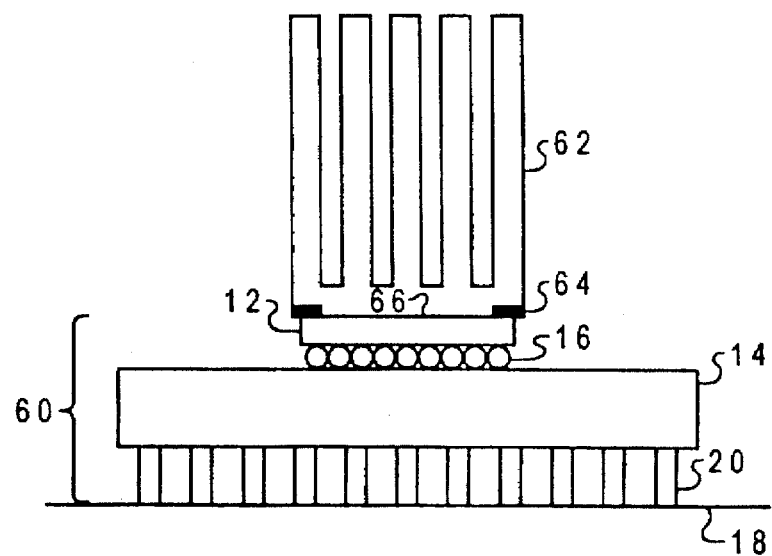
FIG. 6 depicts a capless single chip module to which a preferred embodiment of the heat sink apparatus of the present invention is attached.

Referring now to FIG. 6, there is illustrated a capless single chip module to which a heat sink is attached according to the present invention. As indicated by like reference numerals, several components within capless SCM 60 are similar to those within SCM 10. However, since SCM 60 is capless, heat sink 62 is attached directly to the upper (inactive) surface of chip 12 by adhesive 64. As is other embodiments of the present invention, heat is transferred from chip 12 to heat sink 62 through a layer of thermally conductive material 66. As is well-known to those skilled in the art, the upper surface of chip 12 will be distorted due to chip fabrication and attachment processes as well as at operating temperatures. To maximize the efficiency of thermal transmission from chip 12 to heat sink 62, the surface of heat sink 62 mated to chip 12 can be contoured to approximate the upper surface of chip 12 as distorted at operating temperatures. Thus, by machining or molding the mating surface of heat sink 62, a relatively uniform gap can be maintained between heat sink 62 and chip 12.

Figure 7A:
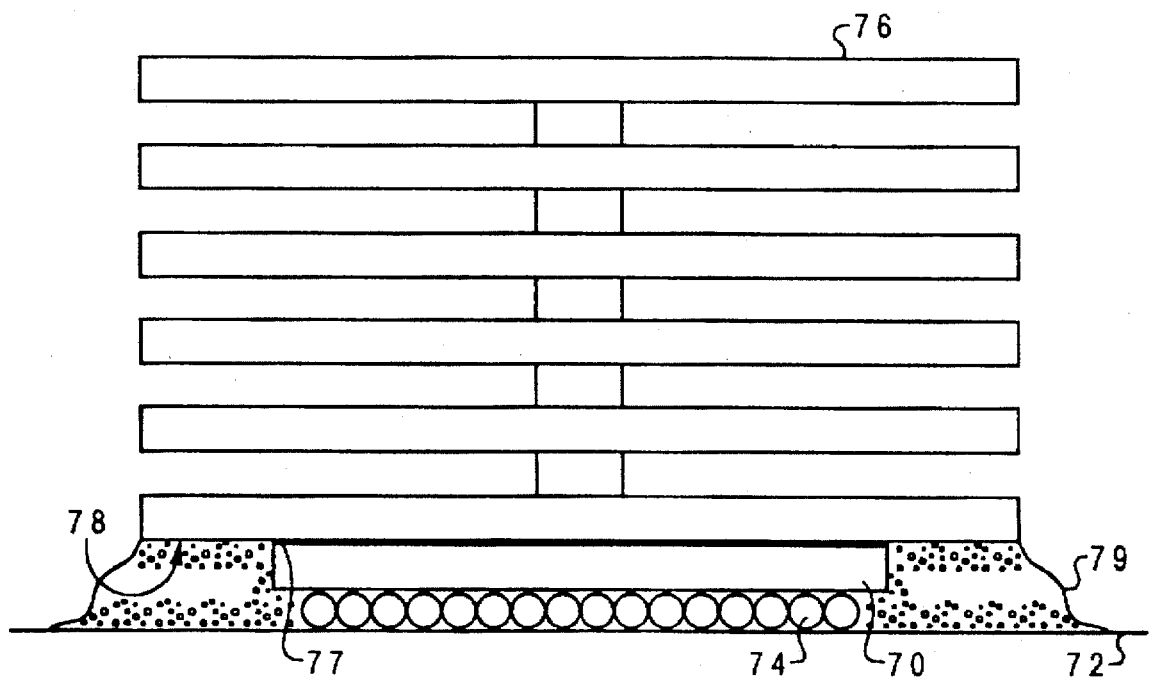
FIG. 7A and 7B illustrate elevation and top plan views of a surface-mounted IC chip to which a heat sink is attached according to the present invention.
Figure 7B:
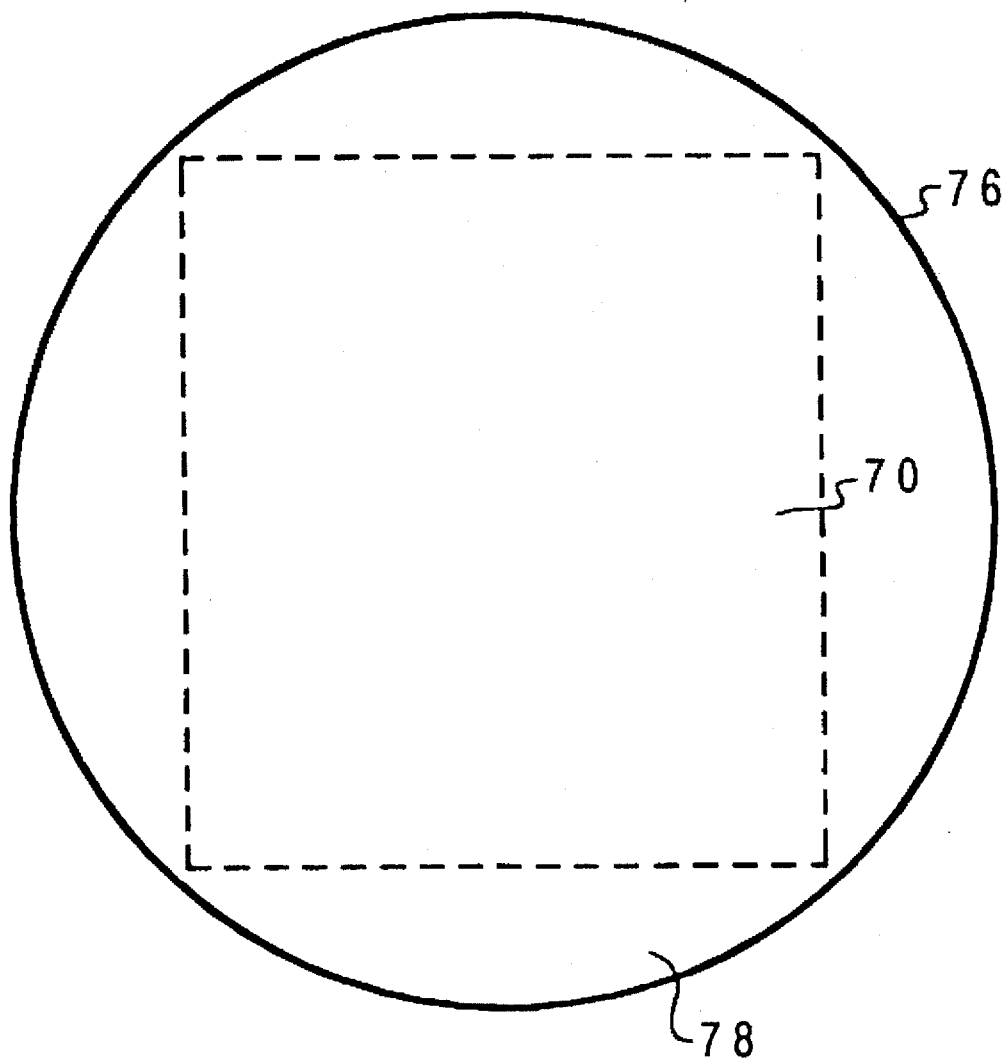

With reference now to FIGS. 7A and 7B, there are illustrated elevation and top plan views of a preferred embodiment of the present invention in which a nondirectional heat sink is attached to a surface-mounted IC chip. As illustrated, chip 70 is electrically and mechanically connected to substrate or circuit card 72 by chip connection 74. Chip 70 is underfilled with an adhesive to protect chip connection 74 and to strengthen the mechanical connection of chip 70 and circuit card 72. Like other embodiments of the present invention, chip 70 is equipped with a heat sink 76 to dissipate heat generated by chip 70. Heat is conducted from the upper surface of chip 70 to heat sink 76 through thermally conductive material 77. As depicted in FIGS. 7A and 7B, the diameter of the lower surface of heat sink 76 is preferably larger than at least one dimension of the top surface of chip 70 such that arcuate regions 78 of the lower surface of heat sink 76 extend beyond chip 70. Heat sink 76 is attached to circuit card 72 and held in proximity to chip 70 by adhesive 79, which preferably comprises the same adhesive utilized to underfill chip 70.

Figure 8:
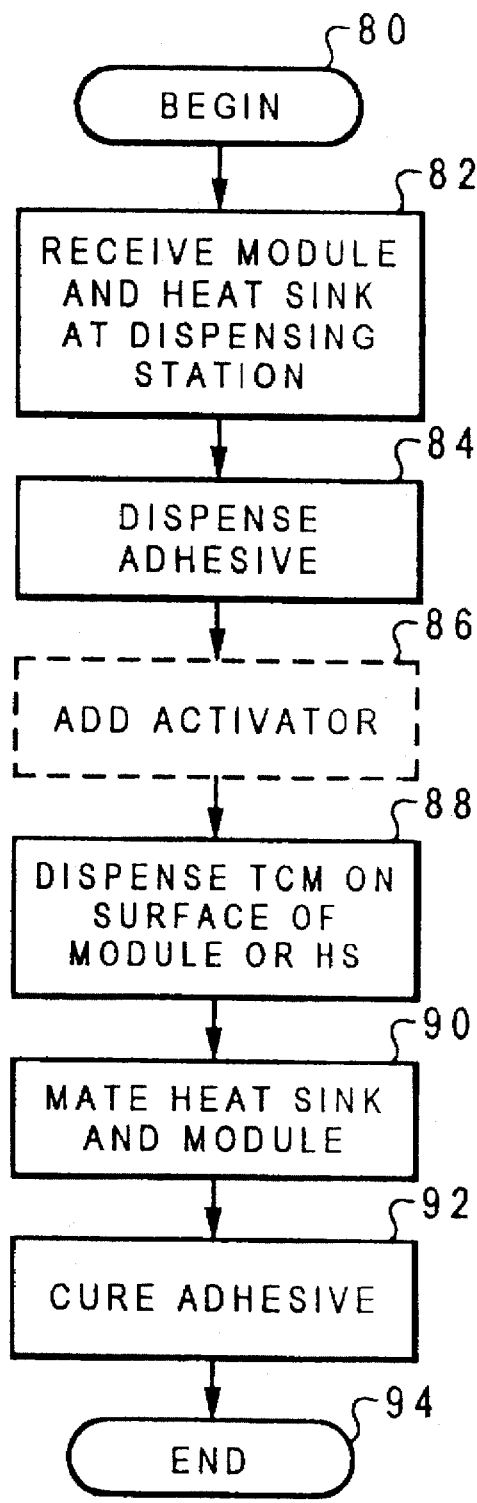
FIG. 8 is a flowchart depicting a preferred embodiment of the method of attaching a heat sink apparatus to an electronic device according to the present invention.

Referring now to FIG. 8, there is depicted a flowchart of a preferred embodiment of the method for attaching a heat sink to an electronic device according to the present invention. To maximize process efficiency, the method of the present invention is preferably performed by an automated assembly line; however, the method depicted in FIG. 8 can also be performed manually. As illustrated, the process begins at block 80 and thereafter proceeds to block 82, which depicts receiving an electronic device module and a heat sink at a dispensing station. To promote a strong adhesive bond, the electronic device module and the heat sink are preferably clean when received at the dispensing station. Furthermore, the electronic device module is preferably mounted on a circuit card and tested prior to receipt at the dispensing station. Testing the electronic device module in situ prior to attaching the heat sink decreases the number of heat sinks which must subsequently be removed to replace a defective electronic device module.

Next, the process proceeds to block 84, which illustrates the dispensing station dispensing adhesive at a number of locations. The dispensing station preferably utilizes positive displacement dispensing in order to provide a controlled amount of adhesive at each of the locations at which adhesive is dispensed. In embodiments of the present invention in which the heat sink is attached directly to the electronic device module, adhesive is dispensed on either the mating surface of the electronic device module or the mating surface of the heat sink. In embodiments of the present invention such as that illustrated in FIGS. 7A and 7B, the adhesive is dispensed both beneath the edges of the chip to encase the chip connection and at locations surrounding the perimeter of the chip for subsequent attachment of the heat sink. The process then proceeds to block 86, which depicts adding an activator to each portion of dispensed adhesive in order to trigger a bonding reaction. As depicted by dashed-line illustration, block 86 is performed only if the selected adhesive utilizes an activator.

The process proceeds from either block 84 or block 86 to block 88, which illustrates the dispensing station dispensing a thermally conductive material on the surface of at least one of the electronic device module and the heat sink. Again, positive displacement dispensing is preferably utilized to control the amount of thermally conductive material dispensed, and consequently to control the interface gap between the electronic device module and the heat sink. Although positive displacement dispensing is preferably employed, those skilled in the art will appreciate that in alternative embodiments of the present invention in which the thermally conductive material is not a fluid, alternative process steps are performed. For example, in embodiments of the present invention in which the thermally conductive material is configured as sheet stock, block 88 illustrates laying a sheet of the thermally conductive material on the mating surface of either the heat sink or the electronic device module. Furthermore, block 88 is performed at different times in the process sequence depending upon the adhesive, thermally conductive material, and heat sink configuration employed. For example, in some embodiments of the present invention, block 88 may be performed prior to block 84. Alternatively, as described above with reference to FIG. 5B, the thermally conductive material can be injected into the interface between the heat sink and electronic device module subsequent to mating the heat sink and electronic device module in embodiments of the present invention which include inlets 32 (i.e., block 88 can be performed subsequent to block 92).

The process proceeds from block 88 to block 90, which depicts mating the heat sink and electronic device module. Next, the process proceeds to block 92 which depicts curing the adhesive. As will be appreciated by those skilled in the art, the type of curing required depends upon the type of adhesive selected. For example, if a pressure-sensitive adhesive is utilized, the curing step illustrated at block 92 entails maintaining a pressure of 10 psi for two minutes. Alternatively, if the adhesive is an epoxy, the adhesive is cured by heating the electronic device module and heat sink apparatus within an oven for two hours at 150° C. and a pressure of 10 psi. As another example, if the adhesive is a UV-sensitive adhesive, the adhesive is cured by irradiating the adhesive with ultraviolet radiation. The present invention enables UV-sensitive adhesive to be utilized since the adhesive is accessible to a UV source around the perimeter of the electronic device module. Thereafter, the process terminates at block 94.

As has been described, the present invention provides an improved apparatus for dissipating heat generated by an electronic device and an improved method for attaching a heat sink apparatus to an electronic device. By utilizing both a high performance thermally conductive material to transfer heat from the electronic device to the heat sink and an inexpensive and durable adhesive attachment, the present invention provides improved thermal integrity at a reasonable cost.

While the invention has been particularly shown and described with reference to a preferred embodiment, it will be understood by those skilled in the art that various changes in form and detail may be made therein without departing from the spirit and scope of the invention.

What is claimed is:

1. An apparatus comprising:

a heat transfer body mounted in proximity to an electronic device, said heat transfer body having a surface;

an adhesive distributed on said heat transfer body, wherein said adhesive affixes said surface of said heat transfer body in proximity to said electronic device, said adhesive being distributed such that heat transfer from said electronic device to said heat transfer body occurs substantially independently of said adhesive; and a thermally conductive material disposed between and in contact with said electronic device and said surface of said heat transfer body, wherein said thermally conductive material is a liquid at an operating temperature of said electronic device;

wherein said surface of said heat transfer body is in contact with both said thermally conductive material and said adhesive, said surface having at least one channel formed therein that is located between regions of said surface contacted by said adhesive and regions of said surface contacted by said thermally conductive material such that said at least one channel limits contact between said thermally conductive material and said adhesive.

2. The apparatus of claim 1, wherein said thermally conductive material comprises a low viscosity oil.

3. The apparatus of claim 1, wherein said adhesive is distributed at a plurality of noncontiguous locations on said heat transfer body.

4. The apparatus of claim 1, wherein said surface of said heat transfer body includes at least one recess formed therein at one or more locations corresponding to one or more locations at which said adhesive is distributed, said at least one recess having a bonding surface to which said adhesive is affixed.

5. The apparatus of claim 4, wherein said at least one recess comprises a chamfer formed at a perimeter of said surface of said heat transfer body.

6. The apparatus of claim 5, said electronic device including a mounting surface upon which said heat transfer body is mounted, wherein said adhesive forms a continuous bead adjacent to a perimeter of said mounting surface of said electronic device.

7. The apparatus for dissipating heat of claim 1, wherein a volume of said at least one channel is greater than volumetric expansion of said thermally conductive material within an operating range of temperatures of said electronic device.

8. The apparatus of claim 1, and further comprising said electronic device, wherein said electronic device includes:

an integrated circuit chip;

a package enclosing said integrated circuit chip, said package having a mounting surface that supports said heat transfer body, wherein said mounting surface is in direct contact with said thermally conductive material; and a connection for connecting said electronic device to a substrate.

9. The apparatus of claim 8, said mounting surface having a first region to which said adhesive is affixed and a second region that directly contacts said thermally conductive material.

10. The apparatus of claim 9, wherein said heat transfer body is substantially coextensive with said mounting surface of said package.

11. The apparatus of claim 1, and further comprising said electronic device, wherein said electronic device comprises an integrated circuit chip having a mounting surface that supports said heat transfer body, said mounting surface having a first region to which said adhesive is affixed and a second region that directly contacts said thermally conductive material.

12. The apparatus of claim 11, wherein said heat transfer body is substantially coextensive with said mounting surface of said integrated circuit chip.

* * * * *